(12) United States Patent
Umezawa

(10) Patent No.: US 8,437,240 B2
(45) Date of Patent: May 7, 2013

(54) FERROELECTRIC RECORDING MEDIUM AND METHOD OF MANUFACTURING THE SAME, INFORMATION PROCESSING DEVICE, AND METHOD OF PROCESSING INFORMATION

(75) Inventor: Tomokazu Umezawa, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 111 days.

(21) Appl. No.: 13/074,530

(22) Filed: Mar. 29, 2011

(65) Prior Publication Data

US 2011/0242961 A1 Oct. 6, 2011

(30) Foreign Application Priority Data

Mar. 31, 2010 (JP) ................................. 2010-082502

(51) Int. Cl.
*G11B 11/00* (2006.01)
*G11B 9/00* (2006.01)

(52) U.S. Cl.
USPC ..................... 369/126; 369/13.02; 369/13.22; 369/13.39; 369/13.4; 369/13.54

(58) Field of Classification Search ............... 369/13.02, 369/13.06, 13.14, 13.12, 13.22, 13.24, 13.29, 369/13.32, 13.39, 13.4, 13.53, 13.54, 126
See application file for complete search history.

(56) References Cited

U.S. PATENT DOCUMENTS

| | | | |
|---|---|---|---|
| 6,026,457 A | 2/2000 | Lee | |
| 2004/0027935 A1 | 2/2004 | Cho et al. | |
| 2007/0133358 A1* | 6/2007 | Kubo et al. | ................. 369/13.38 |
| 2007/0274192 A1* | 11/2007 | Gidon et al. | ................... 369/126 |
| 2009/0175153 A1* | 7/2009 | Gidon et al. | ................... 369/126 |

FOREIGN PATENT DOCUMENTS

| | | |
|---|---|---|
| JP | 03-071447 | 3/1991 |
| JP | 09-091776 | 4/1997 |
| JP | 09-198729 | 7/1997 |
| JP | 10-040599 | 2/1998 |
| JP | 2006-012385 | 1/2006 |
| JP | 4141745 | 6/2008 |
| JP | 2009-129492 | 6/2009 |

* cited by examiner

*Primary Examiner* — Aneeta Yodichkas
(74) *Attorney, Agent, or Firm* — Young & Thompson

(57) ABSTRACT

A ferroelectric recording medium includes a ferroelectric recording layer on an electrode layer, which includes an insulative layer on the ferroelectric recording layer, and includes non-continuous electrically conductive coating portions on the insulative layer.

10 Claims, 4 Drawing Sheets

Electrically conductive probe side

Electrode layer side

Fig. 4

Process for preparation of medium (1) LT single crystal

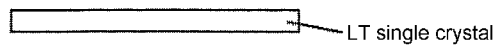
LT single crystal (2) Sputtering of electrically conductive film (Cr) on the LT single crystal

Cr film
LT single crystal (3) Bonding of structure (2) on Si wafer

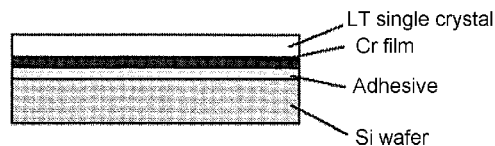
LT single crystal
Cr film
Adhesive
Si wafer (4) Mechanical polishing of LT single crystal

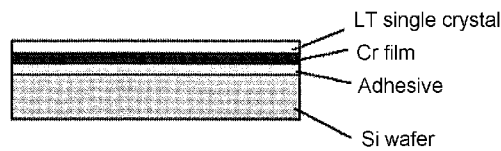
LT single crystal
Cr film
Adhesive
Si wafer (5) Dry-etching of LT single crystal

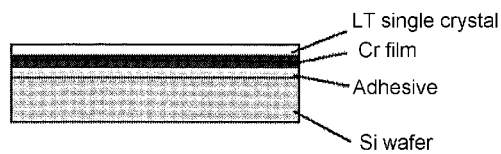
LT single crystal
Cr film
Adhesive
Si wafer (6) Formation of insulative protective layer by sputtering

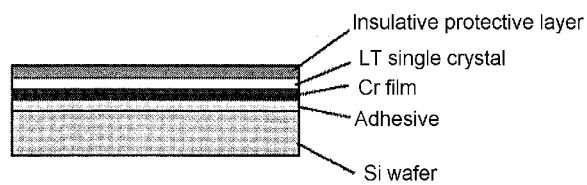
Insulative protective layer
LT single crystal
Cr film
Adhesive
Si wafer (7) Formation of electrically conductive coating portions by reverse sputtering

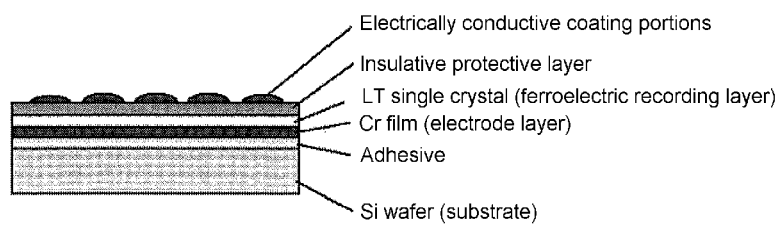
Electrically conductive coating portions
Insulative protective layer
LT single crystal (ferroelectric recording layer)
Cr film (electrode layer)
Adhesive
Si wafer (substrate)

Fig. 5
Example 1 (900 seconds for reverse sputtering)
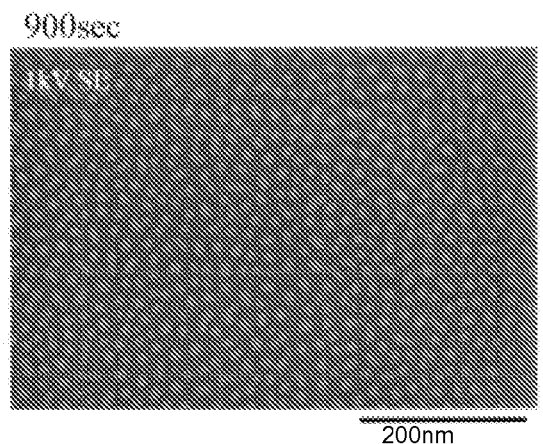
Example 3 (600 seconds for reverse sputtering)
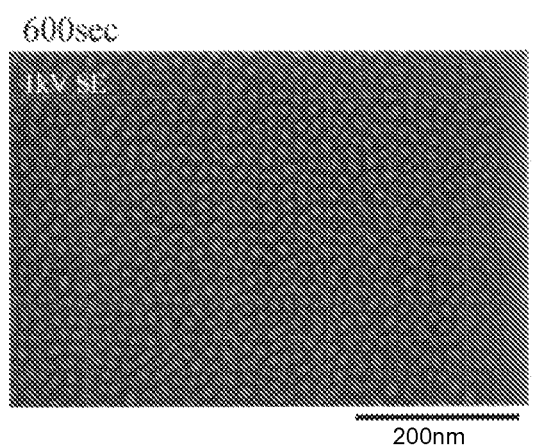
Example 4 (1200 seconds for reverse sputtering)
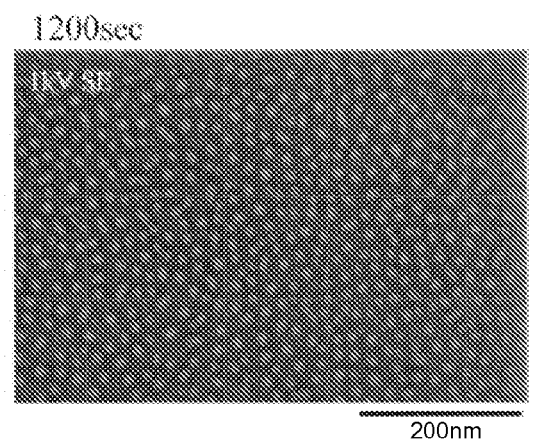

FERROELECTRIC RECORDING MEDIUM AND METHOD OF MANUFACTURING THE SAME, INFORMATION PROCESSING DEVICE, AND METHOD OF PROCESSING INFORMATION

CROSS-REFERENCE TO RELATED APPLICATIONS

This application claims the benefit of priority under 35 USC 119 to Japanese Patent Application No. 2010-082502, filed on Mar. 31, 2010, which is expressly incorporated herein by reference in its entirety.

BACKGROUND OF THE INVENTION

1. Field of the Invention

The present invention relates to a ferroelectric recording medium that permits the recording of information by reversing the polarization of a ferroelectric material, and to a method of manufacturing the same.

The present invention further relates to an information processing device comprising the above ferroelectric recording medium, and to a method of processing information employing the above ferroelectric recording medium.

2. Discussion of the Background

Means of rapidly transmitting terabyte levels of information have developed to a marked degree in recent years, permitting the transmission of images and data comprised of vast quantities of information. As data transmission techniques have improved, the achievement of higher recording capacity has become necessary in recording and reproducing devices and recording media for recording, reproducing, and storing information. However, the recording density in magnetic recording, typified by hard disc drives (HDDs), is limited by thermal fluctuation to about 100 Gbit/inch in longitudinal recording, and to about 1 Tbit/inch$^2$ even in perpendicular recording. Thermal recording media are known. However, due to the intervention of thermal conduction, these media are capable of achieving recording densities of about 500 Gbit/inch$^2$ to 1 Tbit/inch$^2$.

A recording method utilizing the spontaneous polarization of ferroelectric materials (ferroelectric recording) has been attracting attention among high-capacity recording media in recent years. In ferroelectric recording, utilization of the spontaneous polarization of a ferroelectric material with the application of an external electric field presents the possibility of achieving high capacities greatly exceeding those achieved by conventional recording methods.

When recording information on a ferroelectric recording medium, by scanning an electrically conductive probe of a scanning tunneling microscope (STM), an atomic force microscope (AFM), or the like over a ferroelectric recording layer formed on an electrode layer, an electric field is applied between the probe and the electrode layer. The electric field reverses the polarization in the ferroelectric recording layer to cause minute domains (polarization regions) to form. The information thus recorded can also be read by scanning an electrically conductive probe over the ferroelectric recording layer. In such a recording method, there is a concern that contact or collision with the probe will damage or abrade the ferroelectric recording layer. Accordingly, to prevent this, the providing of a protective layer on the ferroelectric recording layer and the forming of a lubricant layer on the ferroelectric recording layer have been proposed (see Japanese Unexamined Patent Publication (KOKAI) Heisei No. 9-198729 or English language family member U.S. Pat. No. 6,026,457 and Japanese Patent No. 4,141,745 or English language family member US2004/0027935A1, which are expressly incorporated herein by reference in their entirety).

The forming of a protective layer or lubricant layer on the ferroelectric recording layer as described above is an effective means of increasing the durability of the ferroelectric recording medium. However, the results of investigation by the present inventor have revealed that stable recording and reproduction sometimes become difficult with a recording medium in which a protective layer or the like has been formed on a ferroelectric layer in this manner.

SUMMARY OF THE INVENTION

An aspect of the present invention provides for a ferroelectric recording medium permitting stable recording and reproduction even when a protective layer or lubricant layer has been formed on a ferroelectric recording layer.

As a result of extensive research, the present inventor concluded that when the layer that was provided on the recording layer was insulative, the surface of this layer developed a charge and problems were created in controlling the distance between the probe and the medium, rendering stable recording and reproduction difficult. This was due to the action of attractive and repulsive Coulomb forces when the surface of the medium built up a charge. However, since electric fields were locally applied to form minute domains (polarization regions) in the recording layer during ferroelectric recording, the application of such localized electric fields became impossible when the electrical conductivity of the layer formed on the recording layer was high, precluding the formation of sharp magnetic bits and causing a drop in recording characteristics.

As the result of repeated research conducted based on this knowledge, the present inventor discovered that the above ferroelectric recording medium could be obtained by employing a configuration comprising localized regions of electrical conductivity on an insulative layer as the layer formed on the recording layer to protect it or the like. This was attributed to the locally provided electrically conductive regions playing a role in preventing charge buildup, thereby making it possible to apply an electric field locally to portions not covered by the electrically conductive regions.

The present invention was devised based on this knowledge.

An aspect of the present invention relates to a ferroelectric recording medium comprising a ferroelectric recording layer on an electrode layer, which comprises an insulative layer on the ferroelectric recording layer, and comprises non-continuous electrically conductive coating portions on the insulative layer.

The ratio of portions which are coated by the electrically conductive coating portions on a surface of the insulative layer may range from 10 to 70 percent.

The thickness of the electrically conductive coating portions may range from 0.2 to 10 nm.

A further aspect of the present invention relates to an information processing device, which comprises:

the above ferroelectric recording medium, and an information processing head comprising an electrically conductive probe that records and/or reproduces information on the ferroelectric recording medium.

The information processing head may be a head that records and/or reproduces information by a scanning nonlinear dielectric measurement method.

A still further aspect of the present invention relates to a method of processing information in a ferroelectric recording medium, wherein the ferroelectric recording medium is the above ferroelectric recording medium, and an electric field is applied between the electrically conductive probe of the information processing head and the electrode layer contained in the ferroelectric recording medium to form polarization regions in the ferroelectric recording layer contained in the ferroelectric recording medium, thereby recording information The information recording may be conducted with bit lengths that are greater than an average diameter of the electrically conductive coating portions The above method may further comprise reproducing the recorded information by a scanning non-linear dielectric measurement method.

A still further aspect of the present invention relates to a method of manufacturing a ferroelectric recording medium, wherein the ferroelectric recording medium is the above ferroelectric recording medium, and the method comprises forming the insulative layer and forming the electrically conductive coating portions by depositing spots of an electrically conductive material on the insulative layer.

The forming of the electrically conductive coating portions may be conducted by reverse sputtering of an electrically conductive material film and depositing sputter particles that has been scattered by the reverse sputtering on the insulative layer.

The present invention can provide a ferroelectric recording medium that permits stable recording and reproduction while preventing a drop in durability.

Other exemplary embodiments and advantages of the present invention may be ascertained by reviewing the present disclosure and the accompanying drawing.

BRIEF DESCRIPTION OF THE DRAWINGS

The present invention will be described in the following text by the exemplary, non-limiting embodiments shown in the figure, wherein:

FIG. 4 is a descriptive drawing of the steps of manufacturing a ferroelectric recording medium in Examples.

FIG. 5 is the SEM image of a ferroelectric recording medium manufactured in Examples.

DETAILED DESCRIPTION OF THE EMBODIMENTS

Figure 1:
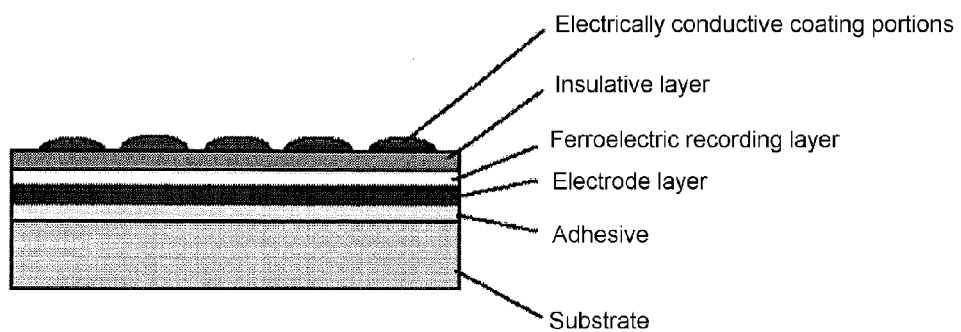
FIG. 1 is a schematic sectional view of an example of the layer structure of the ferroelectric recording medium of the present invention.

Unless otherwise stated, a reference to a compound or component includes the compound or component by itself, as well as in combination with other compounds or components, such as mixtures of compounds.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the present invention. At the very least, and not to be considered as an attempt to limit the application of the doctrine of equivalents to the scope of the claims, each numerical parameter should be construed in light of the number of significant digits and ordinary rounding conventions.

Additionally, the recitation of numerical ranges within this specification is considered to be a disclosure of all numerical values and ranges within that range. For example, if a range is from about 1 to about 50, it is deemed to include, for example, 1, 7, 34, 46.1, 23.7, or any other value or range within the range.

The following preferred specific embodiments are, therefore, to be construed as merely illustrative, and non-limiting to the remainder of the disclosure in any way whatsoever. In this regard, no attempt is made to show structural details of the present invention in more detail than is necessary for fundamental understanding of the present invention; the description taken with the drawings making apparent to those skilled in the art how several forms of the present invention may be embodied in practice.

Ferroelectric Recording Medium

The present invention relates to a ferroelectric recording medium comprising a ferroelectric recording layer on an electrode layer. The ferroelectric recording medium of the present invention comprises an insulative layer on the ferroelectric recording layer, and comprises non-continuous electrically conductive coating portions on the insulative layer. The use of this structure makes it possible to prevent charge build-up by means of the electrically conductive coating portions and permits the localized application of an electric field in uncovered (insulative) regions, thereby both preventing a decrease in durability and achieving stable recording and reproduction.

In the present invention, the term "ferroelectric recording layer" means a layer that permits the recording of information by reversal of the polarization of a ferroelectric material. The term "electrically conductive coating portions" means coating portions that are comprised of a material with a specific resistivity of less than $1\times10^3$ $\Omega\cdot m$. The term "insulative layer" means a layer comprised of a material with a specific resistivity of equal to or greater than $1\times10^3$ $\Omega\cdot m$. The same applies to the terms "electrical conductivity," "electrically conductive material," "insulative," and "insulative material." From the perspective of the charge buildup-preventing effect, the specific resistivity of the material constituting the electrically conductive coating portions is desirably equal to or lower than $1\times10^0$ $\Omega\cdot m$, preferably equal to or lower than $1\times10^{-6}$ $\Omega\cdot m$. The lower limit is not specifically limited, but is about $1\times10^{-8}$ $\Omega\cdot m$ when the specific resistivity of available electrically conductive materials is taken into account.

To form sharp recording bits, the specific resistivity of the material constituting the insulative layer is desirably equal to or greater than $1\times10^6$ $\Omega\cdot m$. The upper limit is not specifically limited, but is about $1\times10^{18}$ $\Omega\cdot m$ when the specific resistivity of available insulative materials is taken into account.

The above-stated specific resistivity can be measured, for example, by the four-pin probe method, double ring method (double ring electrode method), and methods in accordance with JIS C 6471. Generally, the specific resistivity of a low-resistance material is desirably measured by the four-pin probe method, while the specific resistivity of a high-resistance material is desirably measured by the double ring method or a method in accordance with JIS C 6471. Accordingly, the specific resistivity of the material constituting the electrically conductive coating portions (electrically conductive material) is desirably measured by the four-pin probe method. By way of example, the Mitsubishi Chemical Analytech Loresta-GP resistivity meter can be employed in four-pin probe measurement. The specific resistivity of the material constituting the insulative layer (insulative material) is desirably measured by the double-ring method or a method in accordance with JIS C 6471. By way of example, the Mitsubishi Chemical Analytech Hiresta-HP resistivity meter can be employed in the double ring method.

The ferroelectric recording medium of the present invention comprises an electrode layer on which are sequentially provided a ferroelectric recording layer, an insulative layer, and non-continuous electrically conductive coating portions. FIG. 1 shows an example (a schematic sectional view) of the layer structure of the recording medium of the present invention having the above layer structure. As shown in FIG. 1, the electrically conductive coating portions in the recording medium of the present invention are a non-continuous phase, not a continuous phase. Thus, the underlying insulative layer is exposed in portions that are not covered by the electrically conductive coating portions. Since electrically conductive regions and insulative regions are formed on the ferroelectric recording layer, charge buildup can be prevented in electrically conductive regions (the electrically conductive coating portions) and the formation of sharp recording bits is possible in insulative regions.

The ferroelectric recording medium of the present invention (also referred to simply as the "recording medium" or "medium", hereinafter) will be described in greater detail below.

Electrode Layer

The electrode layer can be fabricated by forming an electrically conductive thin film on a ferroelectric recording layer, such as that set forth further below, by a means such as sputtering or vapor deposition. The material employed in the electrically conductive thin film can be a metal material such as aluminum, chromium, or platinum, or an oxide such as $InO_2$ with good resistance to corrosion. It is also possible for the substrate to function as an electrode layer if it is comprised of an electrically conductive material. The electrode layer functions as the counter electrode of the electrically conductive probe.

In an embodiment in which the electrode layer is provided on a substrate, the electrical characteristics of the substrate are not specifically limited; it can be either an insulative material or electrically conductive material. For the substrate material, reference can be made to paragraphs [0047] to [0049] in Japanese Unexamined Patent Publication (KOKAI) Heisei No. 9-198729, for example. The electrode layer can be secured to the substrate by a known method such as the use of a resin-based adhesive.

The thickness of the above elecrode layer is, for example, 10 to 500 nm The thickness of the substrate is, for example, 100 nm to 1 mm However, so long as the object of the present invention can be achieved, the above thickness is not a limitation.

Ferroelectric Recording Layer

The ferroelectric material constituting the ferroelectric recording layer is not specifically limited other than that it exhibit ferroelectric properties. From the perspective of electrical characteristics, an oxide ferroelectric material is desirable. Specific examples are lead titanate ($PbTiO_3$), lead zirconate ($PbZrO_3$), barium titanate ($BaTiO_3$), lithium niobate ($LiNbO_3$), and lithium tantalate ($LiTaO_3$). For example a single crystal of $LiTaO_3$ cut along the Z plane of the crystal is suitable as the ferroelectric material for recording information in a direction of polarization perpendicular to the surface of the recording medium. The thickness of the ferroelectric recording layer is desirably equal to or greater than 5 nm, preferably equal to or greater than 10 nm, and more preferably, equal to or greater than 20 nm, and desirably equal to or less than 1,000 nm, preferably equal to or less than 500 nm, and more preferably, equal to or less than 70 nm. When the ferroelectric recording layer is excessively thin, the reversal of polarization becomes difficult. When excessively thick, the voltage required to reverse the polarization of the ferroelectric recording layer rises, and a high write voltage becomes necessary. To achieve a ferroelectric recording layer of desired thickness, prior to the formation of the insulative layer set forth further below, it is possible to mechanically process (polish, grind, or the like) the surface of the ferroelectric recording layer, and/or conduct etching.

Figure 2:
FIG. 2 is a descriptive drawing of a method of recording information on a ferroelectric recording layer.

The principles that lie behind recording and storing information in the ferroelectric recording layer are set forth below. A ferroelectric material has the property of changing its direction of polarization when subjected to an electric field exceeding its coercive electric field. A ferroelectric material also has the property, once its direction of polarization has been changed by the application of an electric field, of maintaining that polarization direction (spontaneous polarization) even after application of the electric field has been stopped. Utilizing these properties, it is possible to record and store information in a ferroelectric recording layer. For example, the polarization direction of a ferroelectric recording layer as a whole is aligned in advance in a direction perpendicular to the surface of the recording medium (the downward direction as shown in FIG. 2, for example). An electric field exceeding the coercive electric field is then applied locally to the ferroelectric recording layer in a direction perpendicular to the surface of the recording medium. In this manner, the direction of polarization of the portions to which the electric field has been applied is reversed. Subsequently, the reversed direction of polarization is maintained even after application of the electric field is stopped. For example, in FIG. 2, when the information to be recorded is binary digital data comprised of "0"s and "1"s, the bit state "0" corresponds to a downward direction of polarization and the bit state "1" to an upward direction of polarization. In this case, it suffices to apply an electric field to the ferroelectric recording layer only when recording the bit state "1". In this manner, information can be recorded and stored in the ferroelectric recording layer.

The principle behind the reproduction of information that has been recorded as directions of polarization in a ferroelectric recording layer is as follows. The non-linear permittivity of a ferroelectric material varies with the direction of polarization. The difference in the non-linear permittivity can be determined by applying an alternating electric field to a ferroelectric material that is lower than its coercive electric field in a direction perpendicular to the surface of the recording medium, and detecting the change in capacitance of the ferroelectric material in that state. The change in capacitance of the ferroelectric material at that time will be weak, but can be sensitively detected by the SNDM method, set forth further below. By detecting the non-linear permittivity (change in capacitance) of the ferroelectric recording layer in this manner, it is possible to reproduce recorded information by reading the direction of polarization of the ferroelectric recording layer.

When the surface of the ferroelectric recording layer on the electrically conductive probe side is covered by an electrically conductive layer, application of the above localized electric field becomes impossible and the formation of sharp recording bits (polarization regions) becomes difficult. Additionally, when the surface of the ferroelectric recording layer on the electrically conductive probe side is covered with just an insulative layer, problems are created in controlling the distance between the medium and the probe by charge buildup in the medium surface and stable recording and reproduction are precluded.

By contrast, providing the insulative layer and the electrically conductive coating portions described further below on the ferroelectric recording layer in the present invention makes it possible to both prevent charge buildup and to form sharp recording bits, that is, to achieve high-density recording.

Insulative Layer

As set forth above, it becomes difficult to form sharp recording bits when a continuous electrically conductive phase is provided on the ferroelectric recording layer. Thus, a continuous phase in the form of an insulative layer is provided on the recording medium of the present invention. The insulative layer can be fabricated by forming an insulating material on the ferroelectric recording layer by a known film forming method, such as sputtering or vapor deposition. The insulative material constituting the insulative layer that is employed can be a semiconductor such as silicon; an oxide such as silica, alumina, zirconia, titania, magnesium oxide, or aluminum oxide; a nitride such as silicon nitride, aluminum nitride, titanium nitride, or boron nitride; a carbide such as silicon carbide or boron carbide; a polymeric insulative material; or the like. From the perspectives of protecting the ferroelectric recording layer and preventing a drop in the durability thereof, a material with a high degree of hardness is desirable. In this regard, nitrides and carbides are desirable. However, with regard to electrical characteristics, a semiconductor material such as silicon is desirable.

The insulative layer can function as a protective layer to protect the ferroelectric recording layer from scratching and abrasion due to contact with the probe. To be able to function as a protective layer, the insulative layer is desirably equal to or greater than 0.5 nm, preferably equal to or greater than 1 nm, and more preferably, equal to or greater than 2 nm in thickness. When taking into account the voltage required to reverse the polarization, this thickness is desirably equal to or lower than 50 nm, preferably equal to or lower than 30 nm, and still more preferably, equal to or lower than 20 nm In the present invention, it is possible to form two or more insulative layers on the ferroelectric recording layer. In that case, the thickness, calculated as the total thickness of the multiple insulative films, desirably falls within the above-stated range.

Electrically Conductive Coating Portions

The recording medium of the present invention comprises non-continuous electrically conductive coating portions on the above insulative continuous-phase layer. This can prevent charge buildup in the surface of the medium. The electrically conductive material constituting the electrically conductive coating portions is not specifically limited other than that it be electrically conductive. Specific examples are carbon black, graphite, gold, silver, copper, platinum, aluminum, titanium, vanadium, chromium, manganese, iron, cobalt, nickel, zinc, tungsten, tantalum, palladium, iron oxide, ruthenium oxide, molybdenum oxide, tin oxide, phthalocyanine blue, and phthalocyanine green. A metallic material is desirable when the ease of forming a spot-shaped coating is taken into account.

The electrically conductive coating portions can contribute to preventing charge build-up in the surface of the medium, but make it difficult to form sharp recording bits when in the form of a continuous phase. Accordingly, in the present invention, non-continuous electrically conductive coating portions are provided on the insulative layer. Here, the term "non-continuous" means a state such that at least some portion of the lower layer, i.e., the insulative layer is exposed.

As set forth further below, a probe is brought into contact with, or is positioned in extremely close proximity to, the surface (recording surface) of the ferroelectric recording medium during recording and reproduction. Thus, the greater the recording and reproduction speed, the greater the tendency for output variation and abrasion to occur due to contact between the probe and the medium surface. Accordingly, during high-speed recording and reproduction (for example, scanning speeds of equal to or higher than 300 nm/s, even equal to or higher than 500 nm/s), it is desirable to increase the smoothness of the medium surface to prevent the occurrence of these phenomena. From this perspective, the thickness of the electrically conductive coating portions is desirably equal to or less than 10 nm, preferably equal to or less than 7 nm, and more preferably, equal to or less than 5 nm For similar reasons, the smoothness of the medium surface, denoted as the average surface roughness Ra as measured by an atomic force microscope, is desirably equal to or less than 5.0 nm, preferably equal to or less than 2.0 nm The lower limit of the Ra is not specifically limited, and can be, for example, about 0.1 nm. The surface roughness Ra can be obtained as the value of the Ra of 1 square micrometer of the medium surface as measured with a NanoScope V made by Nihon Veeco K.K.

Further, from the perspective of preventing charge buildup, the thickness of the electrically conductive coating portions is desirably equal to or greater than 0.2 nm, preferably equal to or greater than 0.5 nm, and more preferably, equal to or greater than 1 nm.

The size of the electrically conductive coating portions (the plan view area when viewing the medium surface from vertically above) is desirably smaller than the recording bit (polarization region) that is formed. When the size of the electrically conductive coating portions is larger than the recording bit, it becomes difficult to form a recording bit of desired bit length, resulting in a reduction in the SNR. Accordingly, it is desirable to determine the size of the electrically conductive coating portions based on the recording density. When taking common recording conditions into account, the average diameter of the electrically conductive coating portions on the insulative layer, as a circular shape of identical area to the plan view thereof (the average diameter of an equivalent circle), desirably falls within a range of 1 to 100 nm, preferably falls within a range of 2 to 20 nm, and more preferably, falls within a range of 3 to 15 nm. The average diameter can be obtained by surface observation with an SEM.

From the perspective of being able to conduct good recording and reproduction while preventing charge buildup, the a ratio of portions which are coated by the electrically conductive coating portions desirably ranges from 10 to 70 percent, preferably from 15 to 60 percent, more preferably from 20 to 55 percent, and still more preferably, from 30 to 55 percent, on the surface of the insulative layer.

The above coating ratio can be determined by image analysis by a scanning electron microscope (SEM). That is, when the surface of the medium on which the electrically conductive coating portions has been formed is viewed by SEM, an SEM image is obtained in which coated portions and uncoated portions appear as differences in black and white density. By binary processing this SEM image to distinguish coated and uncoated portions, the ratio of the surface of the insulative layer that is occupied by electrically conductive coating portions, that is, the coating ratio, can be obtained.

The electrically conductive coating portions can be formed by etching an electrically conductive film formed as a continuous phase, or by depositing spots of an electrically conductive material on the insulative layer. Use of the latter method is desirable to readily and rapidly form minute electrically conductive coating portions. An example of a preferred method is the method by reverse sputtering of an electrically conductive material film and depositing sputter particles that has been scattered by the reverse sputtering on the insulative layer. An example of such a method will be described with reference to FIG. 3.

Figure 3:
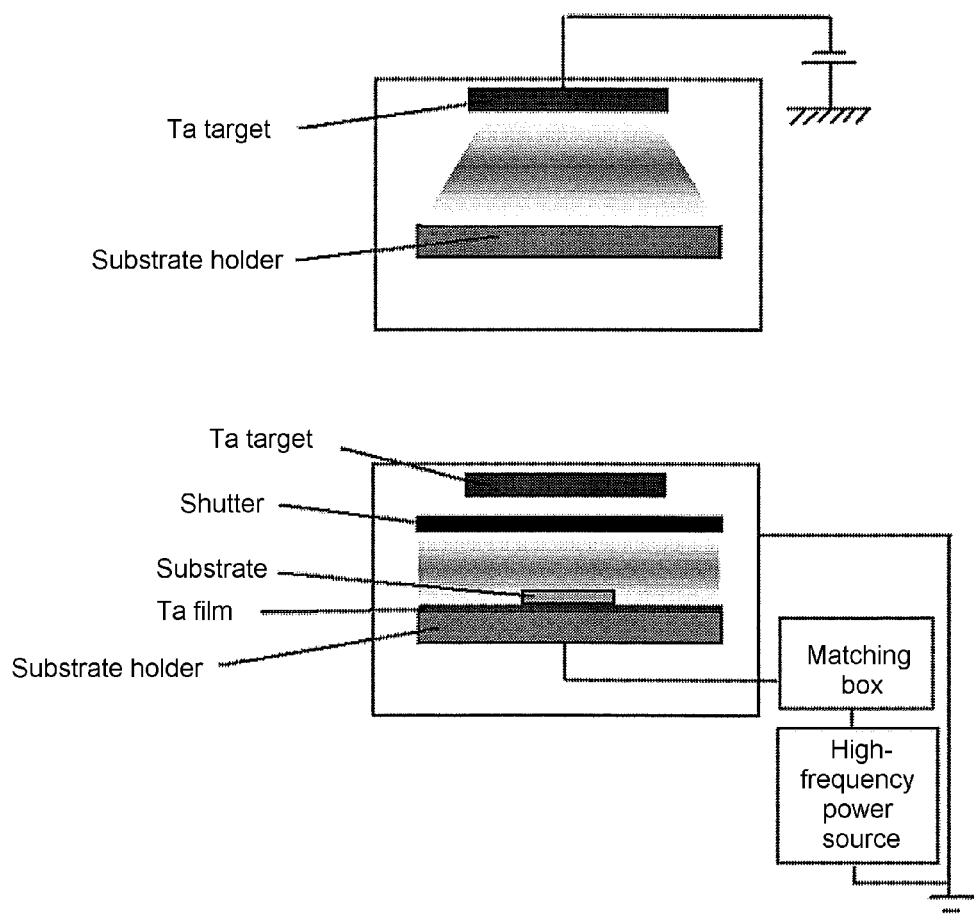
FIG. 3 is a schematic drawing of a sputtering device that can be used to form electrically conductive coating portions.

FIG. 3 is a schematic drawing of a sputtering device for forming electrically conductive coating portions comprised of Ta on an insulative layer by sputtering and reverse sputtering.

First, sputtering is conducted by applying a voltage between a substrate holder and a Ta target, such as those shown in the upper drawing of FIG. 3, within a chamber that has been evacuated and backfilled with an inert gas atmosphere, thereby forming a Ta film on the substrate holder.

Next, with the Ta target blocked by the shutter, a substrate is placed on the Ta film formed above. Here, the substrate is positioned with the insulative layer facing upward (shutter side). When a high-frequency voltage (of 100 kHz to 100 MHz, for example) is applied to the substrate holder in this state, the Ta film is reverse sputtered (sputter etched), and the Ta sputter particles scatter. The scattered sputter particles deposit on the insulative layer, thereby forming electrically conductive coating portions on the insulative layer.

This method can form electrically conductive coating portions in the form of independent microparticles through the self-assembly of sputter particles on the insulative layer. Japanese Unexamined Patent Publication (KOKAI) No. 2009-129492, which is expressly incorporated herein by reference in its entirety, can be consulted for details on this method.

When sputter particles are supplied to the insulative layer by reverse sputtering by the above method, the sputter particles form dots on the surface of the insulative layer. When reverse sputtering is further continued, the dots aggregate, increasing in height. Accordingly, the longer the period of reverse sputtering by this method, the lower the coating ratio becomes and the thicker the electrically conductive coating portions become. Accordingly, the coating ratio of the electrically conductive coating portions and the thickness of the electrically conductive coating portions can be controlled by means of the reverse sputtering period.

The ferroelectric recording medium of the present invention, which comprises an electrode layer on which are sequentially provided a ferroelectric recording layer, an insulative layer, and non-continuous electrically conductive coating portions, can be obtained by the above steps. The ferroelectric recording medium of the present invention can be of any shape, such as disk-shaped. The ferroelectric recording medium of the present invention may comprise the above layer structure on just one side (single-side recording), or on both sides (two-side recording). In addition to the above layers, the ferroelectric recording medium of the present invention may comprise layers that can be formed on a ferroelectric recording medium. For example, the ferroelectric recording medium of the present invention may have a lubricant layer on the outermost surface thereof to prevent abrasion due to contact with the probe. In that case, the lubricant layer that is formed must not be an electrically conductive layer. This is because the formation of an electrically conductive layer over the entire surface of the ferroelectric recording layer would preclude the formation of sharp recording bits, as set forth above. When forming a lubricant layer in the form of an insulative layer, it is necessary for the film thickness thereof to fall within a range that does not impede the charge buildup-preventing effect of the electrically conductive coating portions. From this perspective, the thickness of the lubricant layer formed over the electrically conductive coating portions is desirably equal to or less than 5 nm. From the perspective of achieving both a lubricating effect and a charge buildup-preventing effect, this thickness desirably falls within a range of 1 to 5 nm. The lubricant constituting the lubricant layer is desirably a solid lubricant. Among such lubricants, saturated fatty acids such as stearic acid, dyes such as phthalocyanine, fluororesins such as perfluoropolyether (PFPE), and the like, particularly fluororesins such as PFPE, are desirable for their good lubricating properties. Specific examples are Fomblin-based lubricants such as Fomblin Z-tetraol and Fomblin Z-dol, made by Solvay Solexis K.K., and Moresco Phosparol A20H, made by Matsumura Oil Research Corp.; and Demnum-based lubricants such as Demnum-SA (registered trademark), made by Daikin Industries, Ltd. A lubricant layer can be formed by coating these lubricants on the medium surface by a known coating method such as spin coating or dipping.

The methods of recording and reproducing information on the ferroelectric recording medium of the present invention as set forth above will be described further below.

Information Processing Device

The information processing device of the present invention comprises the ferroelectric recording medium of the present invention, and an information processing head comprising an electrically conductive probe that records and/or reproduces information on the ferroelectric recording medium. The information processing head that is employed can be in the form of a scanning probe microscope such as a scanning tunneling microscope (STM) or atomic force microscope (AFM). Of these, it is desirable to record and/or reproduce information by a scanning non-linear dielectric measurement method to achieve high-density recording and high-sensitivity reproduction. The term "scanning non-linear dielectric measurement method" is a measurement method (the "SNDM method") that applies the technique of scanning non-linear dielectric microscope (SNDM). A summary description thereof will be set forth below.

A nanometer-scale probe (electrically conductive probe) formed of a metal such as tungsten is employed to record and reproduce information. When recording information on a ferroelectric recording medium, the surface of the medium is scanned with the probe. The probe is either brought into contact with the surface (recording surface) of the ferroelectric recording medium, or is positioned in extremely close proximity to the surface of the ferroelectric recording medium. An electric field exceeding the coercive electric field is applied to the ferroelectric recording medium by the probe, reversing the direction of polarization of the ferroelectric recording medium immediately beneath the probe. The level of the voltage applied is varied based on the information to be recorded in the form of a pulsed signal. This pulsed signal is applied to the ferroelectric recording medium through the probe while displacing the position of the probe relative to the ferroelectric recording medium in a direction parallel to the surface of the ferroelectric recording medium. In this manner, the information is recorded in the ferroelectric recording medium as states of polarization.

The fact that the non-linear permittivity of the ferroelectric material differs with the direction of polarization of the ferroelectric material is utilized when reproducing information that has been recorded on the ferroelectric recording medium. That is, the non-linear permittivity of the ferroelectric recording medium is read by detecting changes in the capacitance of the ferroelectric recording medium, thereby reproducing the information that has been recorded as states of polarization in the ferroelectric recording medium. Specifically, the probe is brought into contact with the surface of the ferroelectric recording medium, or is positioned in extremely close proximity to the surface of the ferroelectric recording medium. An alternating electric field that is smaller than the coercive electric field is then applied to the ferroelectric recording medium, creating a state in which the capacitance of the ferroelectric recording medium changes in alternating fashion. In this state, the change in capacitance of the ferroelectric recording medium is detected through the probe and the information is reproduced.

A detailed description of recording and reproduction heads that are suited to recording and reproduction by the SNDM method set forth above is given in Japanese Patent No. 4,141,745, and the heads described in this patent can be employed in the present invention.

Method of Processing Information

The present invention also relates to a method of processing information in the ferroelectric recording medium of the present invention. In the method of processing information of the present invention, an electric force is applied between the electrically conductive probe of an information processing head and the electrode layer contained in the above-described ferroelectric recording medium to form polarization regions in the ferroelectric recording layer contained in the ferroelectric recording medium, thereby recording information. As set forth above, the polarization regions (recording bits) that are formed here desirably have a plan view area that is larger than the area of the electrically conductive coating portions present in the ferroelectric recording medium. Accordingly, the recording is desirably conducted with bit lengths that are greater than the average diameter of the electrically conductive coating portions.

In the above method of processing information, the recorded information is desirably reproduced by the scanning non-linear dielectric measurement method (SNDM method) from the perspective of high-sensitivity reproduction.

The details of the method of processing information of the present invention are as set forth above.

Method of Manufacturing an Information Recording Medium

The present invention also relates to a method of manufacturing the ferroelectric recording medium of the present invention. In the manufacturing method of the present invention, following the formation of an insulative layer, the above-described electrically conductive coating portions are formed by depositing spots of an electrically conductive material on the insulative layer. The electrically conductive coating portions are desirably formed by reverse sputtering of an electrically conductive material film and depositing sputter particles that has been scattered by the reverse sputtering on the insulative layer.

The details of the manufacturing method of the present invention are also as set forth above.

EXAMPLES

The present invention will be described in detail below based on Examples. However, the present invention is not limited to the examples.

Example 1

A ferroelectric recording medium having the layer structure indicated in FIG. 1 was prepared by the steps schematically shown in FIG. 4. These steps will be described in detail below.

A chromium film (electrically conductive film) was formed to a thickness of 100 nm by sputtering on one side of a Z-cut $LiTaO_3$ single-crystal sheet 250 nm in thickness (denoted as an "LT single crystal" in FIG. 4) (FIGS. 4(1) and (2)).

The chromium layer that was formed was secured with a resin adhesive to a silicon wafer 625 nm in thickness (FIG. 4(3)).

Subsequently, the $LiTaO_3$ single crystal sheet was mechanically polished to a thickness of 1 μm, and then reduced to a final thickness of 50 nm by dry etching (FIGS. 4(4), (5)).

An insulative protective layer (silicon film) was formed on the dry etched $LiTaO_3$ single-crystal sheet to a thickness of 3 nm by sputtering (under an argon atmosphere, 0.5 Pa, RF voltage 200 W) using a Si target (FIG. 4(6)).

Next, electrically conductive coating portions comprised of Ta were formed as spots by reverse sputtering in the sputtering device shown in FIG. 3. The electrically conductive coating portions were formed as set forth below.

First, the interior of a chamber in which a Ta target and a substrate holder had been positioned in the state shown in the upper drawing of FIG. 3 was evacuated and backfilled with an Ar atmosphere (pressure 0.5 Pa). A DC voltage of 300 W was then applied between the Ta target and the substrate holder, and a Ta film was formed to a thickness of 100 nm by sputtering on the substrate holder.

Subsequently, the laminate on which the silicon layer had been formed was positioned within the chamber with the silicon film facing the Ta target. The chamber was then evacuated and backfilled with an Ar atmosphere (pressure 0.5 Pa), and a high frequency RF voltage (180 W) was applied to the substrate holder with the Ta target shielded by the shutter. Application of the voltage for 900 s caused sputter particles (Ta particles) scattered by reverse sputtering from the Ta film on the substrate holder to self-assemble on the silicon film, forming electrically conductive coating portions comprised of Ta.

A ferroelectric recording medium was obtained by the above steps.

Example 2

With the exceptions that the Ta target was replaced with a W target and electrically conductive coating portions comprised of W were formed on the silicon film, a ferroelectric recording medium was prepared by the same method as in Example 1.

Example 3

With the exception that the duration of the voltage application in reverse sputtering was changed to 600 s, a ferroelectric recording medium was prepared by the same method as in Example 1.

Example 4

With the exception that the duration of the voltage application in reverse sputtering was changed to 1,200 s, a ferroelectric recording medium was prepared by the same method as in Example 1.

Comparative Example 1

With the exceptions that a perfluoropolyether (PFPE) lubricant was coated by spin coating on the surface of the LiTaO$_3$ single-crystal sheet following dry etching to form a lubricant layer 20 nm in thickness, and no electrically conductive coating portions were formed, a ferroelectric recording medium was prepared by the same method as in Example 1.

Comparative Example 2

With the exception that no electrically conductive coating portions were formed, a ferroelectric recording medium was prepared by the same method as in Example 1.

Measurement of Specific Resistivity

The specific resistivity of the Ta and W employed as materials to form electrically conductive coating portions in Examples 1 to 4; the specific resistivity of the Si employed as a material to form an insulative layer in Examples 1 to 4 and Comparative Example 2; and the specific resistivity of the PFPE lubricant employed to form a lubricant layer in Comparative Example 1 were measured by the following methods.

(1) Measurement of the Specific Resistivity of Ta and W

Using the target employed in Examples 1 to 4, Ta and W thin films were separately formed to thicknesses of 100 nm on glass substrates under the same sputtering conditions as in Examples 1 to 4. A Mitsubishi Chemical Analytech Loresta-GP resistivity meter was then employed to measure the resistivity (specific resistivity) thereof by the four-pin probe method.

(2) Measurement of the Specific Resistivity of Si

The specific resistivity of the Si target employed in Examples 1 to 4 and Comparative Example 2 was measured by the double ring method with a Mitsubishi Chemical Analytech Hiresta-HP resistivity meter.

(3) Measurement of the Specific Resistivity of PFPE

The specific resistivity of the PFPE lubricant employed in Comparative Example 1 was measured by a method in accordance with JIS C 6471.

(4) Measurement Results

The results of the above measurements are given below.

| | |
|---|---|
| Ta: | $1.3 \times 10^{-7}$ Ω · m |
| W: | $5.3 \times 10^{-8}$ Ω · m |
| Si: | $4.0 \times 10^{3}$ Ω · m |
| PFPE: | $2.9 \times 10^{12}$ Ω · m |

Evaluation Methods

1. Continuous Reproduction Test

A scanning non-linear dielectric microscope (an E-Sweep/NanoNavi scanning probe microscope (probe: DF3-R), non-contact model, made by SII-NT) was used to scan the surface of a ferroelectric recording layer at a scan width of 50 μm, a scan rate of 100 μm/s, and a scan frequency of 1 Hz, and the time during which continuous scanning was possible without being precluded by problems in controlling the distance between the medium and the probe due to charge buildup was adopted as the potential continuous reproduction time.

2. Evaluation of Recording and Reproduction Characteristics

The scanning non-linear dielectric microscope employed in 1. above was used to record a series of bits 100 nm in length separated by spaces 100 nm length on a ferroelectric recording layer, and the SNR when reproduction was conducted in non-linear dielectric microscope (SNDM) mode was measured. A SNR of equal to or greater than 5 dB was evaluated as permitting reproduction with high sensitivity and low noise.

3. The Coating Ratio and Average Diameter of the Electrically Conductive Coating Portions The surfaces of the media of the Examples were observed at a magnification of 200.000-fold by SEM to obtain SEM images. These were binary processed to obtain the coating ratios of the electrically conductive coating portions on the surface of the insulative layer. FIG. 5 shows the SEM images of Examples 1, 3, and 4. The average diameters of the electrically conductive coating portions were obtained from these SEM images.

4. Film Thickness Measurement and Ra Measurement

The thickness of the electrically conductive coating portions formed in Example 1 to 4 were obtained by measuring the difference in level produced by the electrically conductive coating portions with an AFM (a NanoScope V made by Nihon Veeco K.K.). Similarly, AFM was used to measure the Ra of a one micrometer square area of the medium surface of each of Examples 1 to 4 and Comparative Example 2.

The thickness of the layer formed on the ferroelectric layer in Examples 1 to 4 and Comparative Examples 1 and 2 was calculated from the film forming conditions.

The above results are given in Table 1.

TABLE 1

| | Layer formed on the ferroelectric material layer | | Electrically conductive coating portions | | | Coating ratio by the electrically conductive coating portions | Ra of medium surface | Potential continuous reproduction time | SNR |
|---|---|---|---|---|---|---|---|---|---|
| | Material constituting the layer | Thickness | Material constituting the portions | Thickness | Average diameter | | | | |
| Ex. 1 | Si | 3 nm | Ta | 3.5 nm | 11 nm | 36% | 0.6 nm | Equal to or longer than 10 hours | 10 dB |
| Ex. 2 | Si | 3 nm | W | 3.5 nm | 11 nm | 36% | 0.6 nm | Equal to or longer than 10 hours | 10 dB |
| Ex. 3 | Si | 3 nm | Ta | 2.3 nm | 10 nm | 53% | 0.4 nm | Equal to or longer than 10 hours | 8 dB |

TABLE 1-continued

| | Layer formed on the ferroelectric material layer | | Electrically conductive coating portions | | | Coating ratio by the electrically conductive coating portions | Ra of medium surface | Potential continuous reproduction time | SNR |
|---|---|---|---|---|---|---|---|---|---|
| | Material constituting the layer | Thickness | Material constituting the portions | Thickness | Average diameter | | | | |
| Ex. 4 | Si | 3 nm | Ta | 3.7 nm | 11 nm | 37% | 0.6 nm | Equal to or longer than 10 hours | 10 dB |
| Comp. Ex. 1 | PPFE | 20 nm | — | — | — | — | — | Continuous reproduction was impossible. | Measurement was impossible. |
| Comp. Ex. 2 | Si | 3 nm | — | — | — | — | 0.1 nm | Continuous reproduction was impossible. | Measurement was impossible. |

Evaluation Results

In both Comparative Examples 1 and 2, attempts were made to scan the ferroelectric recording layer with an electrically conductive probe, but charge buildup in the medium surface created a problem in controlling the distance between the medium and the probe, precluding scanning. Since scanning with an electrically conductive probe was impossible, recording by the SNDM method was also precluded. This was because the layer fabricated on the ferromagnetic recording layer was also an insulative layer.

By contrast, as shown in Table 1, continuous reproduction of equal to or longer than 10 hours was possible in Examples 1 to 4. This was because charge buildup was prevented by the electrically conductive coating portions that were formed on the insulative layer. High-density recording at a bit length of 100 nm and the high-sensitivity reproduction of information recorded at high density were also possible in Examples 1 to 4.

Based on these results, it was revealed that good recording and reproduction could be achieved with the present invention while forming a layer on the ferroelectric recording layer to protect it or the like.

The ferroelectric recording medium of the present invention is suitable as a high-density recording medium.

Although the present invention has been described in considerable detail with regard to certain versions thereof, other versions are possible, and alterations, permutations and equivalents of the version shown will become apparent to those skilled in the art upon a reading of the specification and study of the drawings. Also, the various features of the versions herein can be combined in various ways to provide additional versions of the present invention. Furthermore, certain terminology has been used for the purposes of descriptive clarity, and not to limit the present invention. Therefore, any appended claims should not be limited to the description of the preferred versions contained herein and should include all such alterations, permutations, and equivalents as fall within the true spirit and scope of the present invention.

Having now fully described this invention, it will be understood to those of ordinary skill in the art that the methods of the present invention can be carried out with a wide and equivalent range of conditions, formulations, and other parameters without departing from the scope of the invention or any embodiments thereof.

All patents and publications cited herein are hereby fully incorporated by reference in their entirety. The citation of any publication is for its disclosure prior to the filing date and should not be construed as an admission that such publication is prior art or that the present invention is not entitled to antedate such publication by virtue of prior invention.

What is claimed is:

1. A ferroelectric recording medium comprising:
    an electrode layer;
    a ferroelectric recording layer on the electrode layer;
    a continuous insulative layer having a first surface on the ferroelectric recording layer; and
    non-continuous electrically conductive coating portions on a second surface of the insulative layer opposite the first surface.

2. The ferroelectric recording medium according to claim 1, wherein a ratio of portions which are coated by the electrically conductive coating portions on the second surface of the insulative layer ranges from 10 to 70 percent.

3. The ferroelectric recording medium according to claim 1, wherein a thickness of the electrically conductive coating portions ranges from 0.2 to 10 nm.

4. An information processing device, which comprises:
    the ferroelectric recording medium according to claim 1, and
    an information processing head comprising an electrically conductive probe that records and/or reproduces information on the ferroelectric recording medium.

5. The information processing device according to claim 4, wherein the information processing head is a head that records and/or reproduces information by a scanning non-linear dielectric measurement method.

6. A method of processing information in a ferroelectric recording medium, wherein
    the ferroelectric recording medium is the ferroelectric recording medium according to claim 1, and
    an electric field is applied between the electrically conductive probe of the information processing head and the electrode layer contained in the ferroelectric recording medium to form polarization regions in the ferroelectric recording layer contained in the ferroelectric recording medium, thereby recording information.

7. The method of processing information according to claim 6, wherein the information recording is conducted with bit lengths that are greater than an average diameter of the electrically conductive coating portions.

8. The method of processing information according to claim 6, which further comprises reproducing the recorded information by a scanning non-linear dielectric measurement method.

9. A method of manufacturing a ferroelectric recording medium, wherein
the ferroelectric recording medium is the ferroelectric recording medium according to claim 1, and
the method comprises forming the continuous insulative layer and then forming the non-continuous electrically conductive coating portions by depositing spots of an electrically conductive material on the second surface of the insulative layer.

10. The method of manufacturing according to claim 9, wherein the forming of the electrically conductive coating portions is conducted by reverse sputtering of an electrically conductive material film and depositing sputter particles that has been scattered by the reverse sputtering on the second surface of the insulative layer.

* * * * *